(12) United States Patent
Jiang

(10) Patent No.: US 7,002,392 B2
(45) Date of Patent: Feb. 21, 2006

(54) CONVERTING SIGNALS FROM A LOW VOLTAGE DOMAIN TO A HIGH VOLTAGE DOMAIN

(75) Inventor: Jian H. Jiang, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/821,017

(22) Filed: Apr. 8, 2004

(65) Prior Publication Data

US 2005/0184789 A1  Aug. 25, 2005

Related U.S. Application Data

(60) Provisional application No. 60/546,514, filed on Feb. 20, 2004.

(51) Int. Cl.
*H03L 5/00* (2006.01)
(52) U.S. Cl. .................................................... 327/333
(58) Field of Classification Search ................... 326/63, 326/68, 80–83; 327/310, 317–319, 321, 327/328, 333
See application file for complete search history.

(56) References Cited

U.S. PATENT DOCUMENTS

| 4,740,713 A | | 4/1988 | Sakurai et al. ............... 307/200 |
| 5,751,179 A | * | 5/1998 | Pietruszynski et al. ..... 327/379 |
| 5,933,027 A | * | 8/1999 | Morris et al. ................. 326/81 |
| 5,952,851 A | * | 9/1999 | Yuen ............................ 326/88 |
| 6,011,409 A | * | 1/2000 | Huang et al. .................. 326/83 |
| 6,750,676 B1 | * | 6/2004 | Honda .......................... 326/81 |
| 6,774,696 B1 | * | 8/2004 | Clark et al. ................. 327/333 |
| 6,784,693 B1 | * | 8/2004 | Fan et al. ...................... 326/81 |

FOREIGN PATENT DOCUMENTS

| EP | 0 417 895 | 7/1990 |
| EP | 0 608 489 | 10/1993 |

OTHER PUBLICATIONS

European Search Report mailed Jun. 2, 2005 re EP Application No. 05 25 0671 (3 pages).

* cited by examiner

*Primary Examiner*—My-Trang Nu Ton
(74) *Attorney, Agent, or Firm*—Baker Botts L.L.P.

(57) ABSTRACT

A method for converting a signal from a low voltage domain to a high voltage domain includes receiving an input signal in a low voltage domain, and using the input signal, controlling a first transistor having a first carrier type, a second transistor having a second carrier type different from the first carrier type, and a third transistor having the second carrier type to produce an output voltage at an output terminal. The first transistor is coupled to the output terminal and further coupled to a first voltage corresponding to a first value in a high voltage domain. The second and third transistors are coupled in series between the output terminal and a second voltage corresponding to a second value in the high voltage domain. The output voltage is selected to correspond to either the first voltage or the second voltage based upon the input signal.

16 Claims, 1 Drawing Sheet

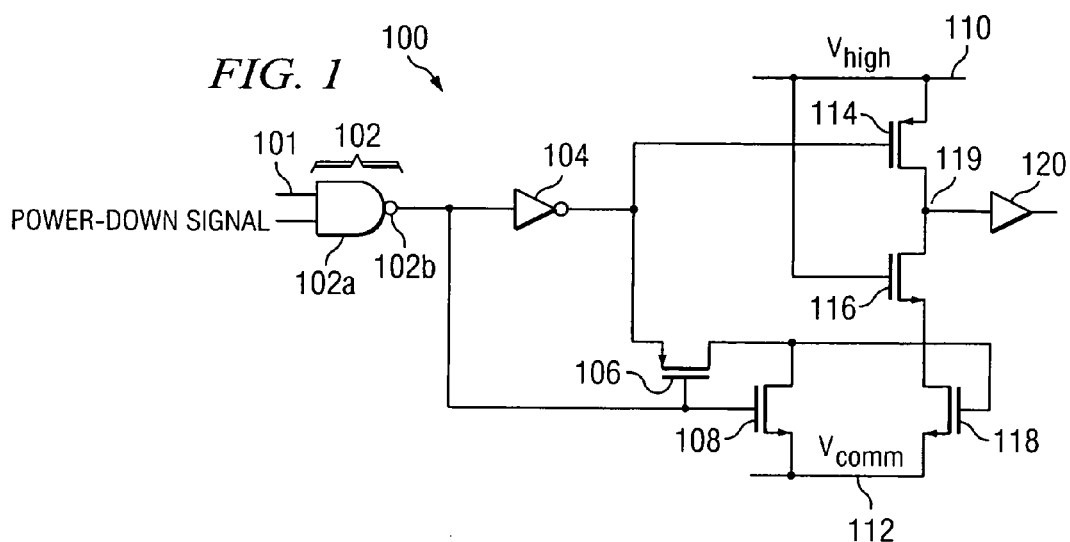
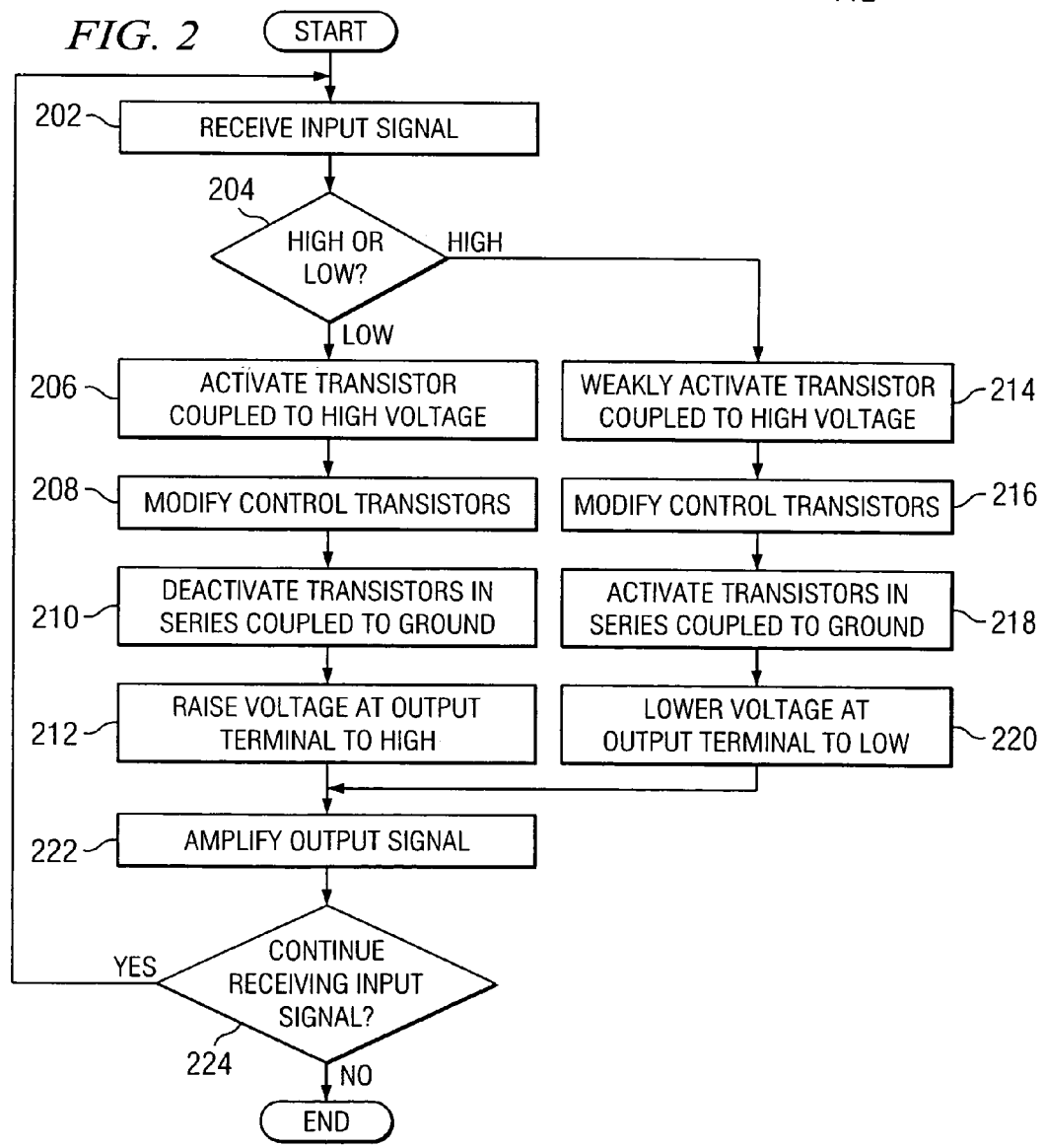

US 7,002,392 B2

CONVERTING SIGNALS FROM A LOW VOLTAGE DOMAIN TO A HIGH VOLTAGE DOMAIN

RELATED APPLICATIONS

This application claims the priority benefit of U.S. Provisional Application Ser. No. 60/546,514 filed Feb. 20, 2004.

TECHNICAL FIELD OF THE INVENTION

This invention relates generally to signal conversion, and more particularly to converting signals from a low voltage domain to a high voltage domain.

BACKGROUND OF THE INVENTION

As the rate of information communication increases, it becomes increasingly important to be able to perform conversions between voltage domains at high speed. Furthermore, since such transitions may consume a large amount of power, it is important for such conversions to be efficient. Accordingly, it would be desirable to have a high frequency solution for converting from the high to low voltage domain that consumes less power.

SUMMARY OF THE INVENTION

In one embodiment of the present invention, a method for converting a signal from a low voltage domain to a high voltage domain includes receiving an input signal in a low voltage domain, and using the input signal, controlling a first transistor having a first carrier type, a second transistor having a second carrier type different from the first carrier type, and a third transistor having the second carrier type to produce an output voltage at an output terminal. The first transistor is coupled to the output terminal and further coupled to a first voltage corresponding to a first value in a high voltage domain. The second and third transistors are coupled in series between the output terminal and a second voltage corresponding to a second value in the high voltage domain. The output voltage is selected to correspond to either the first voltage or the second voltage based upon the input signal.

Important technical advantages of particular embodiments of the present invention include high speed operation. According to particular embodiments, a circuit for converting from the low voltage domain to the high voltage domain may include high speed transistors, and particularly NMOS transistors, thus reducing the response time of components and allowing the circuit to respond to frequencies on the order of gigahertz. Such component configurations may allow the circuit to achieve greater accuracy in processing high frequency signals.

Another advantage of particular embodiments of the present invention is reduced power use. During the cycle of operation, circuits according to particular embodiments of the present invention may not require the components to be constantly powered. Such embodiments may consume less overall power, thus conserving power that may be used by other elements of the system and possibly reducing the overall cost of operating the system as well. This may provide advantages over circuits that require components to be powered constantly, such as converters that use current mirror loading. These and other aspects may help enable applications such as high speed communication.

Other technical advantages will be readily apparent to one skilled in the art from the attached figures, description, and claims. Moreover, while specific advantages have been enumerated above, particular embodiments may include some, all, or none of the enumerated advantages.

BRIEF DESCRIPTION OF THE DRAWINGS

FIG. 1 illustrates a circuit for converting signals from a low voltage domain to a high voltage domain; and
FIG. 2 illustrates an example method of operation for the depicted circuit.

DETAILED DESCRIPTION OF THE INVENTION

FIG. 1 illustrates a circuit 100 for converting an input signal 101 from a low voltage domain to a high voltage domain. Circuit 100 is coupled to a high voltage 110 and a ground or common voltage 112. Circuit 100 converts input signal 101 from a low voltage domain to a high voltage domain. For example, the low voltage domain may be around 1.25 volts, while the high voltage domain, corresponding to high voltage 110, is around 2.5 volts. In the depicted embodiment, circuit 100 includes an inverted NAND gate 102, an inverter 104, and several metal oxide semiconductor field effect transistors (MOSFETs), shown as transistors 106, 108, 114, 116, and 118. Circuit 100 also includes an output amplifier 120.

Inverted NAND gate 102 performs a logical NAND operation with the input signal 101 and a power-down signal. The power-down signal either shuts down or activates circuit 100, allowing power to be saved when circuit 100 is not in operation. In a particular embodiment, power-down signal has high and low values corresponding to the low voltage domain. Inverted NAND gate 102 may include any suitable electronic components, including transistors, resistors or other components.

Inverter 104 represents any suitable component for inverting the output of inverted NAND gate 102. This inverted output is in turn used to control transistors 114 and 118 by providing the output signal to the respective gates of those transistors. Again, inverter 104 introduces a delay cycle in the output signal from inverted NAND gate 102 so that a control signal routed directly from NAND gate 102 would be able to arrive at a control device one or more cycles in advance of the output of inverter 104.

Control transistors 106 and 108 may be any type of transistor of any carrier type. For example, control transistors 106 and 108 may be metal oxide semiconductor field effect transistors (MOSFETs) of either positive carrier type (PMOS) or negative carrier type (NMOS). In the depicted embodiment, control transistors 106 and 108 are PMOS and NMOS transistors, respectively. Control transistors 106 and 108 are coupled at their respective gate terminals to the output of inverted NAND gate 102. Both control transistors 106 and 108 are thus controlled by the output of inverted NAND gate 102. Control transistor 106 is also coupled to the output of inverter 104, allowing control transistor 106 to control the effect of that output. Control transistor 108 is coupled to common voltage 112, which allows control transistor 108 to drop voltages to common voltage 112 when control transistor 108 is activated. The combination allows control transistors 106 and 108 to control the operation of transistor 118.

Transistors 114, 116, and 118 represent any suitable transistor having any primary carrier type (referred to generally as "carrier type"). For example, transistors 114, 116, and 118 may be metal oxide semiconductor field effect transistors (MOSFETs) of either positive carrier type (PMOS) or negative carrier type (NMOS). Transistor 114 is of the opposite carrier type of transistors 116 and 118. Thus, for example, if transistor 114 is a PMOS, then transistors 116 and 118 may be NMOS transistors. Because NMOS transistors typically have a quicker response time than PMOS transistors, it may be desirable for transistors 116 and 118 to be NMOS transistors in order to increase the responsiveness of circuit 100. In the depicted embodiment, transistors 114 and 116 are coupled together at an output terminal 119. Transistor 114 is further coupled to high voltage 110 and the input of output amplifier 120. Thus, transistor 114 may raise the voltage applied to output amplifier 120 to high voltage 110. Transistors 116 and 118 are coupled in series between output terminal 119 and common voltage 112. The configuration of transistors 116 and 118 allows those transistors to bring the voltage applied to the input of output amplifier 120 to common voltage 112.

Output amplifier 120 represents any amplification component for increasing the amplitude of the voltage produce at its input by transistors 114, 116, and 118. Output amplifier 120 typically has a characteristic response time that is much less than that of circuit 100. Accordingly, the additional voltage imparted to the output of circuit 100 by output amplifier 120 is usually significantly less than the amount of voltage difference between the voltage domains, in order to give output amplifier 120 adequate time to amplify the signal. The input of output amplifier 120 corresponds to output terminal 119 of the collection of transistors 114, 116, and 118.

In operation, circuit 100 produces an output signal at high voltage 110 in response to an input signal 101 at low voltage. If input signal 101 is low, inverted NAND gate 102 produces a high output, which is inverted by inverter 104 to a low output, in which case transistor 114 is activated. The high output of inverted NAND gate 102 turns off transistor 106 and turns on transistor 108, which shuts off transistor 118. This has the effect of pulling output terminal 119 to high voltage 110.

If the input signal 101 is high, inverted NAND gate 102 produces a low output which is inverted by inverter 104 to a high output. This weakly activates on transistor 114. The output of inverted NAND gate 102 turns on transistor 106 and turns off transistor 108, which turns on transistor 118. The combined effect of transistors 116 and 118 draws output terminal 119 down to common voltage 112, thus producing a low output.

The particular circuit 100 depicted is only one example of many possible embodiments, each of which may include numerous variations. For example, other suitable components may be used in place of inverted NAND gate 102 and inverter 104 to produce suitable control signals and timing for transistors 114, 116, and 118. In general, different control structures may be used to activate and deactivate transistors 114, 116, and 118, so that, for example, control transistors 106 and 108 may be replaced with a suitable combination of circuit components, such as inverters, diodes, and the like. Also, transistors 114, 116, and 118 may be replaced with transistors of a different type, such as transistors having a different carrier type. Such embodiments should be understood to be within the scope of the described circuit 100.

FIG. 2 is a flow chart 200 illustrating an example method of operation for circuit 100. At step 202, circuit 100 receives input signal 101. The effect of input signal 100 on circuit 100 depends on whether input signal 101 is high or low, as shown by decision step 204. If input signal 101 is low, transistor 114 coupled to high voltage 110 is activated at step 206. Input signal 101 also deactivates transistor 106 and activates transistor 108 at step 208. At step 210, control transistors 106 and 108 in turn lower the gate voltage of transistor 118, which deactivates the series of transistors 116 and 118. Because the series of transistors 116 and 118 is deactivated while transistor 114 is activated, transistor 114 raises the voltage at output terminal 119 to high at step 212.

On the other hand, if the input signal is high, transistor 114 is only weakly activated at step 214. Control transistor 106 is activated and transistor 108 is deactivated at step 216. This allows the output signal from inverter 104 to activate transistor 118 at step 218. The activation of transistor 118, along with the deactivation of transistor 114, in turn allows the series of transistors 116 and 118 to lower the voltage at output terminal 119 to common voltage 112 at step 220.

After the voltage at output terminal 119 is set to either high or low, output amplifier 120 amplifies the signal at step 222. The method may then be repeated from step 202 if circuit 100 continues to receive input signal 101, as shown by decision step 224. Otherwise, the method is at an end. It should be understood that the described method of operation is only one example of many possible methods of operation that may be contemplated for various embodiments. In particular, any method of operation consistent with any of the embodiments described above should be understood to be contemplated within the scope of such an embodiment.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for converting a signal from a low voltage domain to a high voltage domain, comprising:
   receiving an input signal in a low voltage domain;
   using the input signal, controlling a first transistor having a first carrier type, a second transistor having a second carrier type different from the first carrier type, and a third transistor having the second carrier type to produce an output voltage at an output terminal, wherein controlling comprises applying the input signal to at least one control transistor operable to control at least one of the second and third transistors;
   dividing the input signal into two portions, wherein the first portion of the input signal is applied to the control transistor;
   inverting the second portion of the input signal; and
   applying the second portion of the input signal to a gate terminal of the first transistor, wherein:
      the first transistor is coupled to the output terminal and further coupled to a first voltage corresponding to a first value in a high voltage domain;
      the second and third transistors are coupled in series between the output terminal and a second voltage corresponding to a second value in the high voltage domain; and
      the output voltage is selected to correspond to either the first voltage or the second voltage based upon the input signal.

2. The method of claim 1, further comprising amplifying the output voltage by an amount that imparts an additional voltage less than one half of the difference between a maximum value of the high voltage domain and a maximum value of the low voltage domain.

3. The method of claim 1, wherein:
the input signal is received at a logical gate operable to apply a logical operation to the input signal; and
the method further comprises applying the logical operation of the logical gate to the input signal before the transistors are controlled using the input signal.

4. The method of claim 1, wherein:
the high value of the low voltage domain is 1.25 volts; and
the high value of the high voltage domain is 2.5 V.

5. The method of claim 1, wherein the input signal has a frequency greater than 1 gigahertz.

6. A circuit for converting a signal from a low voltage domain to a high voltage domain, comprising:
a receiver operable to receive an input signal in a low voltage domain and to divide the input signal into a first portion and a second portion; and
a first transistor having a first carrier type, wherein the first transistor is coupled to the output terminal and further coupled to a first voltage corresponding to a first value in a high voltage domain;
a second transistor having a second carrier type different from the first carrier type;
a third transistor having the second carrier type, wherein the second and third transistors are coupled in series between the output terminal and a second voltage corresponding to a second value in the high voltage domain; and
a control structure comprising an inverter operable to invert the second portion of the input signal and further comprising at least one control transistor operable to control at least one of the second and third transistors, the control structure operable to control the first, second, and third transistors to produce an output at the output terminal corresponding to either the first voltage or the second voltage in response to the input signal, to apply the first portion of the input signal to the control transistor, and to apply the second portion of the input signal to a gate terminal of the first transistor.

7. The circuit of claim 6, further comprising an output amplifier operable to amplify the output voltage by an amount that imparts an additional voltage less than one half of the difference between a maximum value of the high voltage domain and a maximum value of the low voltage domain.

8. The circuit of claim 6, wherein the receiver comprises a logical gate operable to apply the operation of the logical gate to the input signal.

9. The circuit of claim 6, wherein:
the high value of the low voltage domain is 1.25 volts; and
the high value of the high voltage domain is 2.5 V.

10. The circuit of claim 6, wherein the input signal has a frequency greater than 1 gigahertz.

11. A circuit for converting a signal from a low voltage domain to a high voltage domain, comprising:
means for receiving an input signal in a low voltage domain;
means for controlling a first transistor, a second transistor, and a third transistor to produce an output voltage at an output terminal using the input signal, the first transistor having a first carrier type, the second transistor having a second carrier type different from the first carrier type, and the third transistor having the second carrier type, wherein controlling comprises applying the input signal to at least one control transistor operable to control at least one of the second and third transistors;
means for dividing the input signal into two portions, wherein the first portion of the input signal is applied to the control transistor;
means for inverting the second portion of the input signal; and
means for applying the second portion of the input signal to a gate terminal of the first transistor, wherein:
the first transistor is coupled to the output terminal and further coupled to a first voltage corresponding to a first value in a high voltage domain;
the second and third transistors are coupled in series between the output terminal and a second voltage corresponding to a second value in the high voltage domain; and
the output voltage is selected to correspond to either the first voltage or the second voltage based upon the input signal.

12. The circuit of claim 11, further comprising means for amplifying the output voltage by an amount that imparts an additional voltage less than one half of the difference between a maximum value of the high voltage domain and a maximum value of the low voltage domain.

13. The circuit of claim 11, further comprising means for applying the logical operation to the input signal before the transistors are controlled by the controlling means.

14. A circuit for converting from a low voltage domain to a high voltage domain, comprising:
an inverted NAND gate;
an inverter coupled to the inverted NAND gate;
a first transistor having a first carrier type, the first transistor coupled to a high voltage corresponding to a high value in a high voltage domain and further coupled to an output terminal and to the inverter at a gate terminal of the first transistor;
a second transistor having a second carrier type different from the first carrier type coupled to the output terminal;
a third transistor having the second carrier type coupled in series with the second transistor between the output terminal and a low voltage corresponding to a low value in the high voltage domain;
a fourth transistor coupled to the inverter at a gate terminal of the fourth transistor and further coupled to a gate terminal of the third transistor; and
a fifth transistor coupled to the inverted NAND gate at a gate terminal of the fifth transistor and further coupled to the second voltage and the gate terminal of the third transistor.

15. The circuit of claim 14, wherein:
the first, second, third, fourth, and fifth transistors are all metal oxide semiconductor field effect transistors (MOSFETs);
the first and fourth transistors are positive carrier type MOSFETs; and
the second, third, and fifth transistors are negative carrier type MOSFETs.

16. The circuit of claim 14, further comprising an output amplifier operable to amplify the output voltage by an amount substantially less than the difference between the maximum values of the high and low voltage domains.

* * * * *